(12) United States Patent
Wang

(10) Patent No.: US 10,153,305 B2
(45) Date of Patent: Dec. 11, 2018

(54) ARRAY SUBSTRATE, MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/522,651

(22) Filed: Oct. 24, 2014

(65) Prior Publication Data
US 2015/0372013 A1 Dec. 24, 2015

(30) Foreign Application Priority Data
Jun. 19, 2014 (CN) .......................... 2014 1 0277117

(51) Int. Cl.
*H01L 31/20* (2006.01)
*G02F 1/1343* (2006.01)
(Continued)

(52) U.S. Cl.
CPC .......... *H01L 27/124* (2013.01); *G02F 1/1362* (2013.01); *G02F 1/134309* (2013.01);
(Continued)

(58) Field of Classification Search
CPC .............. G02F 1/1309; G02F 1/134336; G02F 1/136286; G02F 1/1368; G02F 1/136259; H01L 27/12; H01L 27/1214; H01L 27/124
(Continued)

(56) References Cited

U.S. PATENT DOCUMENTS 6,031,512 A * 2/2000 Kadota ............. G02F 1/133516
345/88
9,281,320 B2 3/2016 Ham et al.
(Continued)

FOREIGN PATENT DOCUMENTS

CN 1459657 A 12/2003
CN 101625493 A 1/2010
(Continued)

OTHER PUBLICATIONS

First Office Action dated Apr. 1, 2016 corresponding to Chinese application No. 201410277117.4.
(Continued)

*Primary Examiner* — Brian Turner
(74) *Attorney, Agent, or Firm* — Nath, Goldberg & Meyer; Joshua B. Goldberg

(57) ABSTRACT

The present invention provides an array substrate, a manufacturing method thereof and a display device, relates to the field of display technology. The array substrate comprises: a substrate; a gate metal layer comprising gate lines; a source and drain metal layer comprising data lines, the gate lines and the data lines intersecting with each other to define a plurality of sub-pixel areas; a pixel electrode layer provided on the substrate, which comprises a plurality of pixel electrodes which are in one-to-one correspondence with the plurality of sub-pixel areas; a common electrode layer provided on the substrate, which is provided with a plurality of cutting hole at positions corresponding to spaces between the pixel electrodes; a first insulating layer provided between the pixel electrode layer and the common electrode layer; and a second insulating layer provided between the gate metal layer and the source and drain metal layer.

9 Claims, 6 Drawing Sheets

(51) Int. Cl.
   *H01L 31/036*  (2006.01)
   *H01L 27/146*  (2006.01)
   *H01L 29/80*   (2006.01)
   *H01L 27/12*   (2006.01)
   *G02F 1/1362*  (2006.01)
   *H01L 29/66*   (2006.01)
   *H01L 29/786*  (2006.01)

(52) U.S. Cl.
   CPC ...... *H01L 27/1248* (2013.01); *H01L 27/1259* (2013.01); *H01L 29/66742* (2013.01); *H01L 29/786* (2013.01)

(58) Field of Classification Search
   USPC ............. 257/59, 72, E33.053; 438/158, 653; 349/46, 139
   See application file for complete search history.

(56) References Cited

U.S. PATENT DOCUMENTS

| | | | |
|---|---|---|---|
| 9,520,414 B2 | 12/2016 | Wang et al. | |
| 2002/0101557 A1* | 8/2002 | Ono | G02F 1/134363 349/143 |
| 2002/0126078 A1* | 9/2002 | Horibe | C09K 11/595 345/87 |
| 2003/0081164 A1 | 5/2003 | Sato et al. | |
| 2004/0027525 A1* | 2/2004 | Itakura | G02F 1/134363 349/141 |
| 2010/0128192 A1* | 5/2010 | Kim | G02F 1/134363 349/46 |
| 2012/0050643 A1* | 3/2012 | Li | H01L 27/12 349/61 |
| 2012/0249454 A1* | 10/2012 | Teraguchi | G06F 3/0412 345/173 |
| 2013/0162570 A1* | 6/2013 | Shin | G06F 3/041 345/173 |
| 2013/0208206 A1* | 8/2013 | Park | H01L 29/41733 349/46 |
| 2014/0085577 A1* | 3/2014 | Zhou | G02F 1/134363 349/106 |
| 2014/0104527 A1* | 4/2014 | Yang | H01L 27/1225 349/43 |
| 2014/0138693 A1* | 5/2014 | Ham | G02F 1/134309 257/59 |
| 2014/0285478 A1* | 9/2014 | Ono | G09G 3/3614 345/209 |
| 2015/0309377 A1 | 10/2015 | Choi et al. | |
| 2015/0380671 A1* | 12/2015 | Shu | G02F 1/133617 257/13 |

FOREIGN PATENT DOCUMENTS

| | | |
|---|---|---|
| CN | 103309081 A | 9/2013 |
| CN | 103713431 A | 4/2014 |
| CN | 104007589 A | 8/2014 |
| WO | 2012070448 A1 | 5/2012 |

OTHER PUBLICATIONS

2nd Office Action issued in corresponding Chinese application No. 201410277117.4 dated Oct. 8, 2016.
The Fourth Office Action dated Jul. 14, 2017 corresponding to Chinese application No. 201410277117.4.

* cited by examiner even higher field strength at positions corresponding to the gate lines and the data lines, it is possible to effectively drive the liquid crystals between adjacent sub-pixel areas, thus increasing transmittance and avoiding problems such as display delay.

ARRAY SUBSTRATE, MANUFACTURING METHOD THEREOF, AND DISPLAY DEVICE

FIELD OF THE INVENTION

The present invention relates to the field of display technology, and particularly to an array substrate, a manufacturing method thereof and a display device.

BACKGROUND OF THE INVENTION

Compared to common liquid crystal display techniques, ADS (Advanced-super Dimensional Switching) display technique can provide wider angle of view, higher transmittance, shorter response time and higher brightness and contrast, and is therefore becoming more popular.

In an ADS-LCD (Advanced-Super Dimensional Switching-Liquid Crystal Display), pixel electrodes and common electrodes are formed in an array substrate, and may generate a multi-dimensional electric filed for driving liquid crystals, thus achieving a display function.

FIG. 1 illustrates a structure of one sub-pixel area of an array substrate of an ADS-LCD, and the structure comprises a gate line 11, a common electrode line 12, a data line 13, a thin film transistor 30 (the region in the dashed circle in FIG. 1), a common electrode 14 and a pixel electrode 15. The thin film transistor 30 indicated by the dashed circle in FIG. 1 comprises: a gate 31 electrically connected to the gate line 11 through which a gate signal may be supplied to the gate 31; a source 32 electrically connected to the data line 13 through which a source signal may be supplied to the source 32; and a drain 33 electrically connected to the pixel electrode 15 which may be charged through the drain 33. Further, the common electrode 14 is electrically connected to the common electrode line 12 through which an electric signal may be supplied to the common electrode 14.

As shown in FIG. 1, the conventional pixel electrode 15 is provided with a plurality of slits 40 thereon, and when electric signals are applied to the common electrode 14 and the pixel electrode 15 at the same time, fringe fields are formed at the positions of the slits so as to drive the liquid crystals to achieve a display function. As a gate line or a data line is provided between two adjacent sub-pixel areas, the electric field at the positions corresponding to the gate line and the data line is weak, and therefore, it is difficult to drive the liquid crystals, resulting in problems such as low transmittance, display delay and the like.

SUMMARY OF THE INVENTION

Embodiments of the present invention provide an array substrate, a manufacturing method thereof, and a display device, so as to solve the problems of low transmittance and display delay resulting from the fact that it is difficult to drive liquid crystals between pixel electrodes on an conventional array substrate.

To achieve the above object, the embodiments of the present invention employ the technical solutions as follows.

An embodiment of the present invention provides an array substrate comprising: a substrate; a gate metal layer comprising gate lines; a source and drain metal layer comprising data lines, the gate lines and the data lines intersecting with each other to define a plurality of sub-pixel areas; a pixel electrode layer provided on the substrate, the pixel electrode layer comprising a plurality of pixel electrodes which are in one-to-one correspondence with the plurality of sub-pixel areas; a common electrode layer provided on the substrate, the common electrode layer being provided with a plurality of cutting hole at positions corresponding to spaces between the pixel electrodes; a first insulating layer provided between the pixel electrode layer and the common electrode layer; and a second insulating layer provided between the gate metal layer and the source and drain metal layer.

An embodiment of the present invention provides a manufacturing method of an array substrate, which comprises steps of: forming, on a substrate, a gate metal layer comprising gate lines; forming, on the substrate, a source and drain metal layer comprising data lines, wherein the gate lines and the data lines intersect with each other to define a plurality of sub-pixel areas; forming a second insulating layer between the gate metal layer and the source and drain metal layer; forming a pixel electrode layer on the substrate, wherein the pixel electrode layer comprises a plurality of pixel electrodes which are in one-to-one correspondence with the plurality of sub-pixel areas; forming a first insulating layer on the substrate; forming a common electrode layer on the substrate, wherein, in the common electrode layer, a plurality of cutting holes are provided at positions corresponding to spaces between the pixel electrodes.

An embodiment of the present invention provides a display device, which comprises any one of the array substrates provided by the embodiments of the present invention.

BRIEF DESCRIPTION OF THE DRAWINGS

To describe technical solutions of embodiments of the present invention or in the prior art more clearly, the accompanying drawings required to be used in the description of the embodiments or the prior art will be briefly introduced below. Obviously, the accompanying drawings described below are merely some of the embodiments of the present invention, and for those skilled in the art, other drawings may also be obtained based on these accompanying drawings without creative efforts.

REFERENCE NUMERALS

10—glass substrate; 11—gate line; 12—common electrode line; 13—data line; 14—common electrode; 15—pixel electrode; 16—first insulating layer; 17—color filter layer; 20—liquid crystal; 40—slit; 41—cutting hole.

DETAILED DESCRIPTION OF THE EMBODIMENTS

The technical solutions in the embodiments of the present invention will be described clearly and completely below in conjunction with the accompanying drawings in the embodiments of the present invention, and obviously, the described embodiments are merely a part, not all of the embodiments of the present invention. Based on the embodiments in the present invention, all other embodiments obtained by those skilled in the art without creative efforts are within the protection scope of the present invention.

Figure 1:
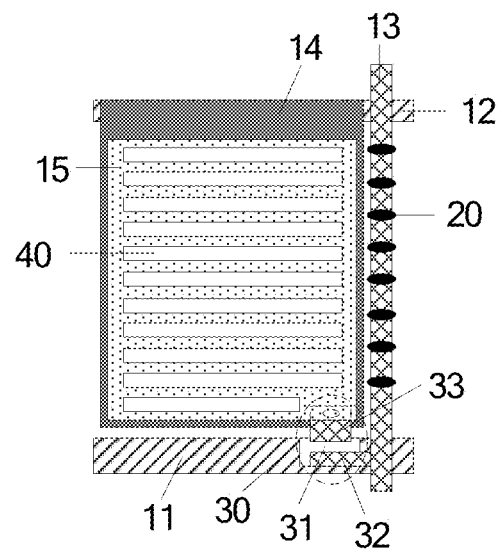
FIG. 1 is a top view of a structure of an existing array substrate.
Figure 2A:
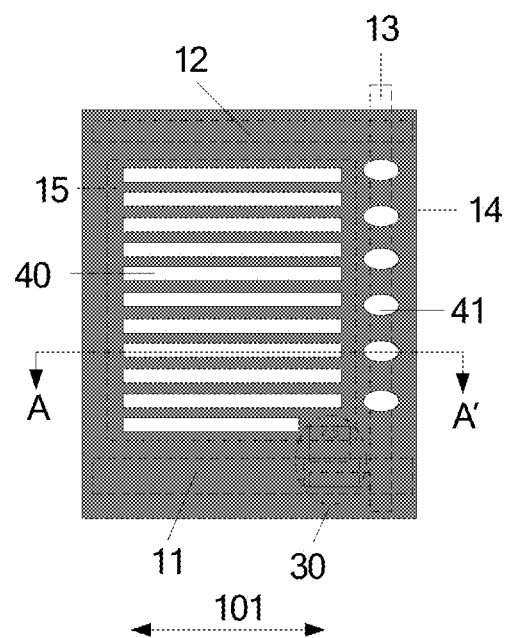
FIG. 2A is a top view of one sub-pixel area of an array substrate according to an embodiment of the present invention, in which the plurality of cutting holes are provided at positions corresponding to the gate lines.
Figure 2B:
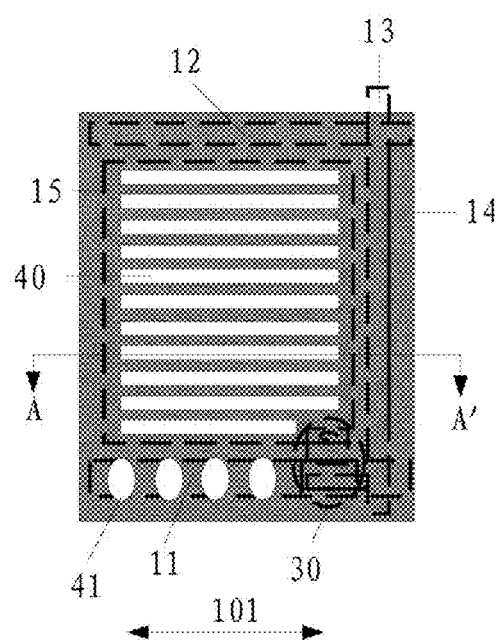
FIG. 2B is a top view of one sub-pixel area of an array substrate according to another embodiment of the present invention, in which the plurality of cutting holes are provided at positions corresponding to the data lines.
Figure 3:
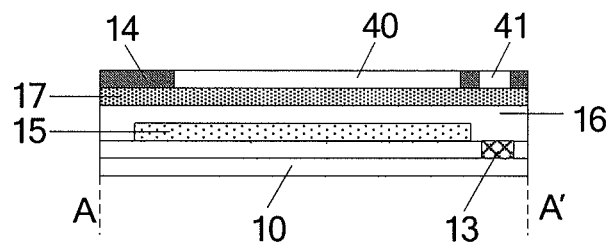
FIG. 3 is a sectional view of one sub-pixel area of an array substrate according to an embodiment of the present invention.

FIG. 2 is a top view of one sub-pixel area of an array substrate according to an embodiment of the present invention; FIG. 3 is a sectional view of one sub-pixel area of an array substrate according to an embodiment of the present invention. As shown in FIGS. 2 and 3, an array substrate according to an embodiment of the present invention comprises a glass substrate 10 and gate lines 11, common electrode lines 12, pixel electrodes 15 and a common electrode 14 formed thereon. The array substrate has a plurality of sub-pixel areas, a pixel electrode layer (i.e., a layer structure corresponding to the pixel electrodes 15) includes a plurality of pixel electrodes 15 which are in one-to-one correspondence with the plurality of sub-pixel areas, and in a common electrode layer (i.e., a layer structure corresponding to the common electrode 14), a plurality of cutting holes 41 are provided at positions corresponding to spaces between pixel electrodes 15.

Display principle of a liquid crystal display including the above array substrate according to the embodiment of the present invention is as follows: by applying electric signals to respective pixel electrodes 15, each of which corresponds to one sub-pixel area, and the common electrode 14, which is generally a planar electrode corresponding to a plurality of sub-pixel areas, electric fields are formed between the common electrode and the pixel electrodes to rotate liquid crystals and to control light transmittance, thus implementing a display function. It should be noted that, in the present embodiment, the common electrode 14 and the pixel electrodes 15 form electric fields at positions corresponding to the cutting holes 41 of the common electrode 14, therefore, liquid crystals at the spaces between the pixel electrodes 15 may be driven to rotate, so as to implement a display function, and thus the problems such as low transmittance caused by delay of liquid crystals between the pixel electrodes and the like are avoided.

In addition, a first insulating layer is provided between the pixel electrode layer and the common electrode layer in the present embodiment. However, the present invention is not limited thereto, and other film(s) or layer structure(s) may also be provided between the pixel electrode layer and the common electrode layer, for example, a passivation layer, a smoothing layer or the like may also be provided between the pixel electrode layer and the common electrode layer. Further, other film(s) or layer structure(s) may also be formed on the array substrate, for example, the array substrate in FIG. 2 further comprises thin film transistors 30, and the embodiments of the present invention only illustrate a part of the films or layer structures related to the present invention.

As shown in FIG. 2, in an embodiment of the present invention, the cutting holes 41 are formed at one side of the pixel electrode 15, but the present invention is not limited thereto, and the cutting holes 41 may be provided all around the pixel electrode 15.

Optionally, as shown in FIG. 2, a gate metal layer (i.e., a layer structure comprising the gate lines 11), a source and drain metal layer (i.e., a layer structure comprising the data lines 13, a source and a drain) and a second insulating layer (not shown in the figure) between the gate metal layer and the source and drain metal layer are provided on the substrate, wherein, the gate metal layer comprises the gate lines 11, the source and drain metal layer comprises the data lines 13, the gate lines 11 and the date lines 13 intersect with each other to define a plurality of sub-pixel areas, and the common electrode 14 is provided with the cutting holes 41 at positions corresponding to the gate lines 11 and/or data lines 13. In FIG. 3, a case in which the common electrode 14 is provided with the cutting holes 41 at positions corresponding to the data lines 13 is taken as an example.

Since the gate lines and the data lines are provided between the pixel electrodes on the substrate, the above positions in the common electrode layer where the cutting holes are provided and which correspond to the spaces between the pixel electrodes are the positions corresponding to the gate lines and/or data lines. As described above, the positions in the common electrode layer where the cutting holes are provided and which correspond to the spaces between the pixel electrodes may be located at one side of a pixel electrode or all around the pixel electrode. Therefore, positions where the cutting holes are located may correspond to positions of the gate lines and/or positions of the data lines.

Optionally, as shown in FIG. 2, slits 40 are provided in the common electrode 14 in a first direction 101, that is, length direction of the slit 40 is the first direction 101, and the cutting holes 41 are provided at positions corresponding to the data lines 13 in the common electrode 14, but no cutting hole is provided at positions corresponding to the gate lines 11 and the common electrode lines 12. With this configuration, electric fields formed by the cutting holes 41 and the pixel electrodes 15 and electric fields formed by the slits 40 and the pixel electrodes 15 have the same direction, and thereby uniformity of the electric fields on the array substrate may be ensured. Of course, the direction in which the slits 40 are provided is not limited to the direction parallel to the gate lines 11 as shown in FIG. 2, and may be a direction with a certain angle with respect to the gate lines 11 or the data lines 13.

Optionally, the cutting holes 41 provided at the positions corresponding to the gate lines 11 and/or the data lines 13 in the common electrode layer specifically are:

cutting holes 41 parallel to the data lines 13 and provided at positions corresponding to the gate lines 11 in the common electrode layer, and the length of the cutting holes 41 in the direction of the data lines 13 being no less than the width of the gate lines 11; and/or cutting holes 41 parallel to the gate lines 11 and provided at positions corresponding to the data lines 13 in the common electrode layer, and the length of the cutting holes 41 in the direction of the gate lines 11 being no less than the width of the data lines 13.

As shown in FIG. 2, taking a case in which the cutting holes 41 are provided at the positions corresponding to the data line 13 in the common electrode layer as an example, the cutting holes 41 are parallel to the gate line 11, and the widths of the cutting holes 41 along the direction of the gate line 11 are no less than the width of the data line 13, that is, the widths of the cutting holes 41 are larger than or equal to the width of the data line 13. Since the pixel electrodes 15 and the common electrode 14 form electric fields at the positions where the cutting holes 41 are located, by making the widths of the cutting holes 41 equal to or larger than the width of the data line 13, electric fields are formed at an area corresponding to the data line 13 and an area around the data line 13 so that liquid crystals at the area corresponding to the data line 13 and the area around the data line 13 are driven to rotate. A case in which the cutting holes 41 parallel to the data line 13 are provided at the positions corresponding to the gate line 11 in the common electrode layer shares the same principle as the case in which the cutting holes 41 parallel to the gate lines 11 are provided at the positions corresponding to the data line 13 in the common electrode layer, and is not repeated herein.

Optionally, as shown in FIG. 2, each of the cutting holes 41 has small openings at both sides close to the pixel electrodes 15 and a large opening in the middle. But the shape of the cutting hole 41 in the present invention is not limited to an oval, and may be any shape, such as a diamond, with small openings at both sides and a large.

Optionally, as shown in FIG. 3, the pixel electrodes 15 are below the common electrode 14. In this case, the pixel electrodes 15 are in one-to-one correspondence with the sub-pixel areas, and the common electrode 14 is integrally formed with a large area, which facilitates manufacturing the array substrate. Integrally forming the common electrode 14 with a large area may specifically include: forming a common electrode film on the substrate, and then forming the slits and the cutting holes through a patterning process and the like.

It should be noted that, the terms "on", "above", "under", "below" and the like used in the embodiments of the present invention are subject to the sequence in manufacturing the array substrate. For example, a pattern which is on or above another pattern indicates that the pattern is formed after said another pattern is formed, and a pattern which is under or below another pattern indicates that the pattern is formed before said another pattern is formed.

Optionally, as shown in FIG. 3, a color filter layer 17 is provided between the pixel electrode layer (i.e., the pixel electrodes 15) and the common electrode layer (i.e., the common electrode 14). Further, as shown in FIG. 3, a first insulating layer 16 is provided between the pixel electrodes 15 and the common electrode 14 to insulate the pixel electrodes 15 from the common electrode 14.

It should be noted that, capacitance between two electrodes is inversely proportional to the distance between the two electrodes, and since the color filter layer 17, which is generally made of a color resin material, is further provided between the common electrode layer and the pixel electrode layer, the distance between the common electrode layer and the pixel electrode layer is increased, and the parasitic capacitance between the common electrode layer and the pixel electrode layer is reduced.

Further, the color filter layer 17 has a thickness of 1.2~1.5 μm. If the color filter layer 17 is too thick, the electric fields between the pixel electrodes 15 and the common electrode 14 will be affected, and therefore, in the embodiments of the present invention, the thickness of the color filter layer 17 is preferably 1.2~1.5 μm.

Figure 4:
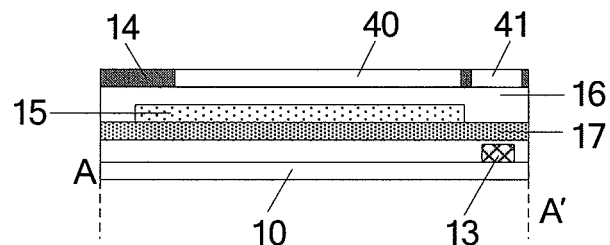
FIG. 4 is a sectional view of one sub-pixel area of an array substrate according to another embodiment of the present invention.

Optionally, as shown in FIG. 4, the color filter layer 17 is further provided on the substrate 10, and the color filter layer 17 is above the gate metal layer (not shown in the figure) and the source and drain metal layer (i.e., the layer structure comprising the data lines 13) and below the pixel electrode layer (i.e., the pixel electrode 15 in the figure) and the common electrode layer (i.e., the common electrode 14 in the figure).

Specifically, the gate metal layer comprises the gate lines and the gates, the source and drain metal layer comprises the data lines, the sources and the drains, and a gate, a source and a drain are three electrodes of a thin film transistor. The drain of the thin film transistor is electrically connected to the pixel electrode, the gate is applied with a gate signal through the gate line, and the source is applied with a source signal through the data line, and when electric signals are supplied to the gate and the source at the same time, the drain is turned on and its corresponding pixel electrode is charged.

According to the positional relationship among the electrodes, thin film transistors may be classified into two categories: bottom-gate thin film transistors with gates below sources and drains, and top-gate thin film transistors with gates above sources and drains. In the array substrate according to an embodiment of the present invention, top-gate thin film transistors or bottom-gate thin film transistors may be adopted. When the top-gate thin film transistors are adopted, the source and drain metal layer is below the gate metal layer, and when the bottom-gate thin film transistors are adopted, the gate metal layer is below the source and drain metal layer.

The color filter layer is provided above the gate metal layer and the source and drain metal layer and below the pixel electrode layer and the common electrode layer. A case in which the source and drain metal layer is above the gate metal layer, and the pixel electrode layer is below the common electrode layer is taken as an example, and in this case, the color filter layer is between the source and drain metal layer and the pixel electrode layer, which may further increase the distance between the source and drain metal layer and the pixel electrode layer, and reduce interference caused by electric signals in the source and drain metal layer and the gate metal layer to the pixel electrode layer and the common electrode layer.

Optionally, the color filter layer includes a film layer of three different colors of red, green and blue. Of course, according to different displays, the color filter layer may also include a film layer of other different colors such as red, green, blue and white, or red, green, blue and yellow. The embodiment of the present invention is described in detail by taking the color filter layer including a film layer of three different colors of red, green and blue as an example.

An embodiment of the present invention provides a display device, which comprises any one of the array substrates provided by the embodiments of the present invention. The display device may be a liquid crystal display device or any product or component comprising the display device and having a display function, such as a television, a digital camera, a mobile phone, a tablet computer, or the like.

Figure 5:
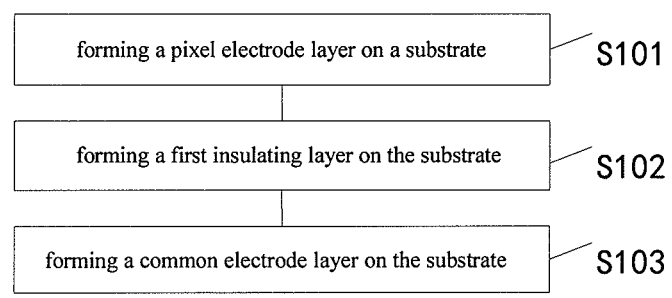
FIG. 5 is a flowchart of a manufacturing method of an array substrate according to an embodiment of the present invention.

As shown in FIG. 5, a manufacturing method of an array substrate according to an embodiment of the present invention comprises steps 101 to 103.

Step 101: forming a pixel electrode layer on a substrate, wherein, the pixel electrode layer comprises a plurality of pixel electrodes in one-to-one correspondence with sub-pixel areas.

The substrate may be a substrate with other film(s) or layer structure(s) formed thereon, and may be a glass substrate with a gate metal layer, a gate insulating layer and a source and drain metal layer formed thereon, for example.

Specifically, the step of forming the pixel electrode layer on the substrate may be performed through a patterning process. The "patterning process" is a process of forming a layer including at least one pattern in a film; and the patterning process generally comprises steps of: coating photoresist on a film, exposing the photoresist by using a mask, using developing solution to wash out the photoresist required to be removed, then etching a part of the film which is not covered by the photoresist, and finally peeling off the remaining photoresist. In all of the embodiments of the present invention, "one pattering process" refers to a process of forming required layer structure through one exposure. For example, in an embodiment of the present invention, the pixel electrode layer is a layer structure which includes patterns of pixel electrodes and is formed from a transparent conductive film through the patterning process.

Specifically, a conductive film is formed on the substrate, and then patterns of a plurality of pixel electrodes in one-to-one correspondence with sub-pixel areas are formed through an exposure with a mask, and the like.

It should be noted that, the pixel electrode layer comprises a plurality of pixel electrodes, each of which is electrically connected to a thin film transistor in the corresponding sub-pixel area to control on-state of the thin film transistor, and thus, through each of the thin film transistors, on-state of the corresponding sub-pixel can be controlled to implement a display function.

Step 102: forming a first insulating layer on the substrate.

Specifically, the first insulating layer may be a silicon nitride film or the like.

Step 103: forming a common electrode layer on the substrate, wherein, a plurality of cutting holes are provided at positions corresponding to spaces between pixel electrodes in the common electrode layer.

Specifically, the common electrode layer may also be formed on the substrate through the patterning process. More specifically, a conductive film may be formed, and then a plurality of cutting holes are formed on the conductive film through an exposure with a mask, and the like. Further, a plurality of slits are provided at a position corresponding to each of the pixel electrodes in the common electrode layer. The pixel electrodes and the common electrode form electric fields at positions corresponding to the slits and the cutting holes, respectively, so as to drive liquid crystals in areas corresponding to the pixel electrodes and liquid crystals at the positions between the plurality of pixel electrodes to rotate, thus avoiding the problem of low transmittance caused by delay of the liquid crystals at the positions between pixel electrodes, and the like.

It should be noted that, the manufacturing method of an array substrate is not limited to the above steps, for example, the sequence of the above step 101 and step 103 may be adjusted accordingly based on specific array substrate. The embodiment of the present invention is described in detail by only taking a case in which the pixel electrodes are formed earlier as an example.

Figure 6:
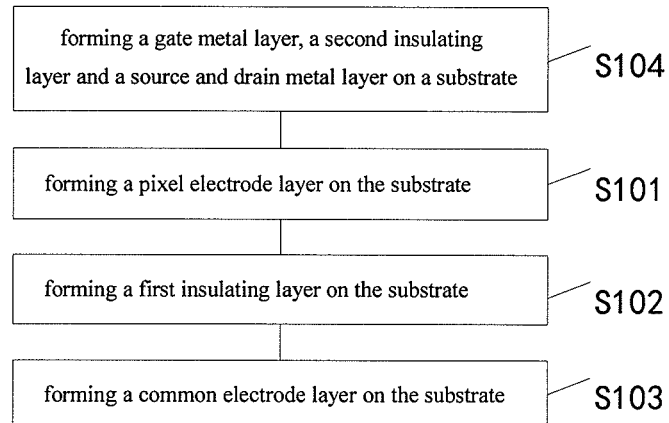
FIG. 6 is a flowchart of a manufacturing method of an array substrate according to another embodiment of the present invention.

Optionally, an embodiment of the present invention provides another manufacturing method of an array substrate, and as shown in FIG. 6, the method further comprises step 104.

Step 104: forming a gate metal layer, a second insulating layer and a source and drain metal layer on the substrate.

In this case, providing the plurality of cutting holes at the positions corresponding to the spaces between the pixel electrodes in the common electrode layer (i.e., the above step 103) specifically is: providing the plurality of cutting holes at positions corresponding to gate lines and/or data lines in the common electrode layer.

Here, the gate metal layer comprises the gate lines, the source and drain metal layer comprises data lines, and the gate lines and the data lines intersect with each other to define a plurality of sub-pixel areas. That is, on the substrate, the gate lines and the data lines are provided between the pixel electrodes, and since the plurality of cutting holes are provided at the positions corresponding to the spaces between the pixel electrodes in the common electrode layer, the plurality of cutting holes are provided at the positions corresponding to the gate lines and/or data lines in the common electrode layer. When the plurality of cutting holes are provided at the positions corresponding to the spaces between the pixel electrodes in the common electrode layer, the cutting holes may be provided at one side of the pixel electrode, and may also be provided all around the pixel electrode. When the cutting holes are provided at one side of the pixel electrode, the cutting holes may be provided at positions corresponding to the gate lines, and may also be provided at positions corresponding to the data lines. When the cutting holes are provided all around the pixel electrode, the cutting holes may be provided at the positions corresponding to both the gate lines and the date lines.

It should be noted that the sequence of step 104 and steps 101 to 103 may be adjusted according to different display panels. The embodiment of the present invention takes a case in which the above step 104 is performed before steps 101 to 103 as an example.

Figure 7:
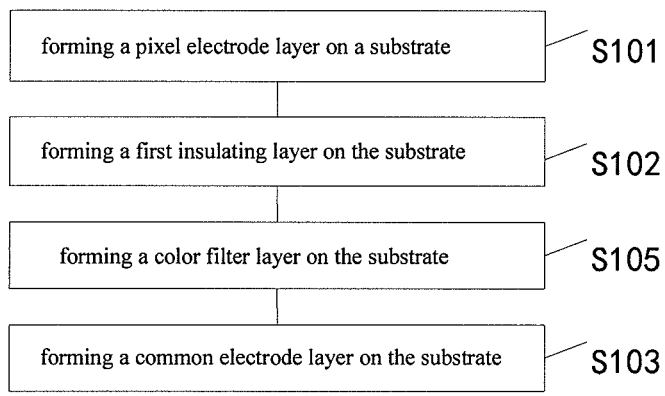
FIG. 7 is a flowchart of a manufacturing method of an array substrate according to still another embodiment of the present invention.

Optionally, an embodiment of the present invention provides still another manufacturing method of an array substrate, and as shown in FIG. 7, after forming the pixel electrode layer on the substrate (i.e., step 101) and before forming the common electrode layer on the substrate (i.e., step 103), the method further comprises step 105.

Step 105: forming a color filter layer on the substrate.

It should be noted that, step 105 is performed between step 101 and step 103, and, step 105 may be performed before or after step 102. The embodiment of the present invention is described by taking a case shown in FIG. 7 in which step 105 is performed after step 102 as an example.

Figure 8:
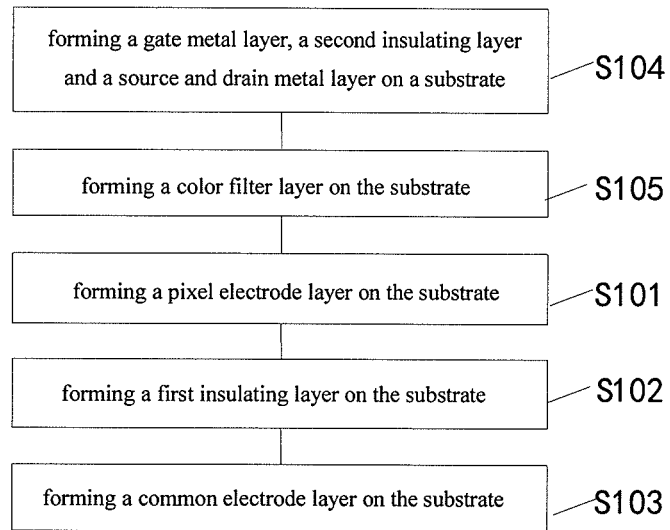
FIG. 8 is a flowchart of a manufacturing method of an array substrate according to another embodiment of the present invention.

Optionally, an embodiment of the present invention provides another manufacturing method of an array substrate, and as shown in FIG. 8, before forming the pixel electrode layer and the common electrode layer on the substrate (i.e., before steps 101 and 103) and after forming the gate metal layer, the second insulating layer and the source and drain metal layer on the substrate (i.e., after step 104), the method further comprises step 105.

Step 105: forming a color filter layer on the substrate.

As shown in FIG. 4, in the formed array substrate, the color filter layer 17 is provided above the gate metal layer (not shown in the figure) and the source and drain metal layer (i.e., the data line 13 in FIG. 4), and below the pixel electrode layer (i.e., the pixel electrode 15 in FIG. 4) and the common electrode layer (i.e., the common electrode 14 in FIG. 4). In FIG. 4, taking a case in which the source and drain metal layer is above the gate metal layer, and the pixel electrode layer is below the common electrode layer as an example, the color filter layer is between the source and drain metal layer and the pixel electrode layer, which may further increase the distance between the source and drain metal layer and the pixel electrode layer, and reduce interference caused by electric signals in the source and drain metal layer and the gate metal layer to the pixel electrode layer and the common electrode layer.

Figure 9:
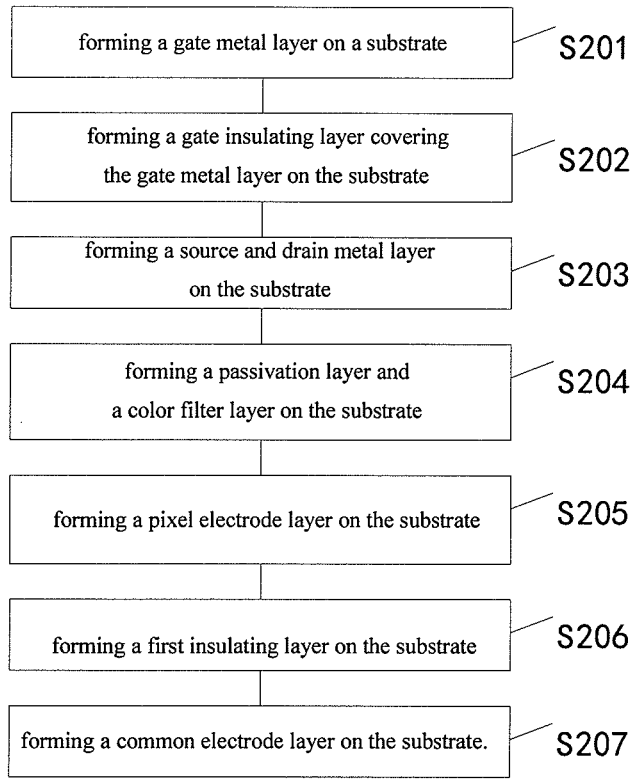
FIG. 9 is a detailed flowchart of a manufacturing method of an array substrate according to an embodiment of the present invention.

Below, a specific embodiment of the present invention will be described for illustrating a manufacturing method of an array substrate, and as shown in FIG. 9, the method specifically comprises steps 201 to 207.

Step 201: forming a gate metal layer on a substrate.

Here, the gate metal layer comprises gate lines, gates and a common electrode line.

Step 202: forming a gate insulating layer covering the gate metal layer on the substrate.

Here, the gate insulating layer is the second insulating layer.

Step 203: forming a source and drain metal layer on the substrate.

Here, the source and drain metal layer comprises data lines, sources and drains.

Step 204: forming a passivation layer and a color filter layer on the substrate.

It should be noted that, according to requirements of different displays, the passivation layer may not be formed, and the embodiment of the present invention is only described by taking the above as an example.

Specifically, first via-hole and a second via-hole are provided in the passivation layer and the color filter layer.

Step 205: forming a pixel electrode layer on the substrate.

Here, the pixel electrode layer comprises a plurality of pixel electrodes which are in one-to-one correspondence with the sub-pixel areas. Each of the pixel electrodes is electrically connected to the drain through the first via-hole.

Step 206: forming a first insulating layer on the substrate.

Here, the second via-hole is formed in the first insulating layer.

Step 207: forming a common electrode layer on the substrate.

Here, in the common electrode layer, a plurality of slits are provided at a position corresponding to each of the pixel electrodes, and a plurality of cutting holes are provided at positions corresponding to the data lines between the pixel electrodes. The common electrode is electrically connected to the common electrode line through the second via-hole, and is supplied with a common electrode signal through the common electrode line.

Of course, the manufacturing method of an array substrate provided by the embodiment of the present invention is not limited to the above steps. For example, the sequence of forming the common electrode layer on the substrate and forming the pixel electrode layer on the substrate may be adjusted accordingly according to the structure of a specific array substrate, and the embodiment of the present invention is only described in detail by taking the above as an example. With the above steps, the array substrate shown in FIG. 4 can be formed.

Figure 10:
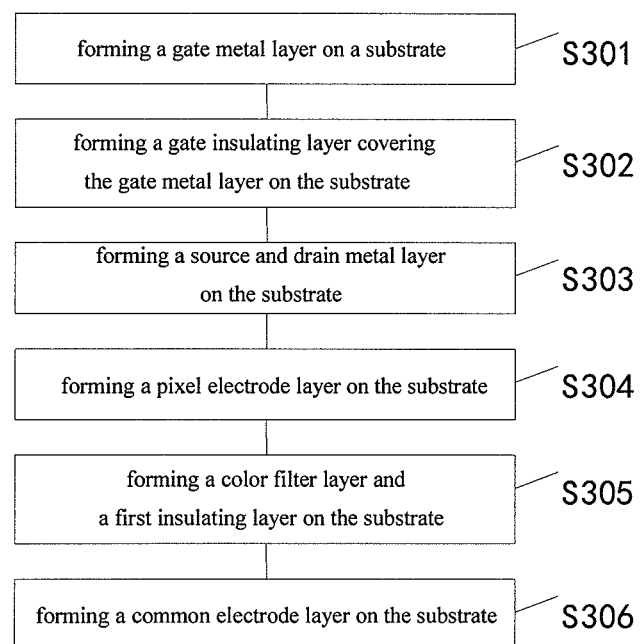
FIG. 10 is a detailed flowchart of a manufacturing method of an array substrate according to another embodiment of the present invention

As shown in FIG. 10, an embodiment of the present invention provides another specific embodiment for illustrating a manufacturing method of an array substrate provided by the embodiment of the present invention. The method specifically comprises steps 301 to 306.

Step 301: forming a gate metal layer on a substrate.

Here, the gate metal layer comprises gate lines, gates and a common electrode line.

Step 302: forming a gate insulating layer covering the gate metal layer on the substrate.

Here, the gate insulating layer is the second insulating layer.

Step 303: forming a source and drain metal layer on the substrate.

Here, the source and drain metal layer comprises data lines, sources and drains.

Step 304: forming a pixel electrode layer on the substrate.

Here, the pixel electrode layer comprises a plurality of pixel electrodes which are in one-to-one correspondence with the sub-pixel areas. Each of the pixel electrodes is electrically connected to the drain.

Step 305: forming a color filter layer and a first insulating layer on the substrate.

Here, the color filter layer formed on the substrate may be a film layer of three colors of red, blue and green. A second via-hole is formed in the first insulating layer and the color filter layer.

Step 306: forming a common electrode layer on the substrate.

Here, in the common electrode layer, a plurality of slits are provided at a position corresponding to each of the pixel electrodes, and a plurality of cutting holes are provided at positions corresponding to the data lines between the pixel electrodes. The common electrode is electrically connected to the common electrode line through the second via-hole, and is supplied with a common electrode signal through the common electrode line.

In addition, the manufacturing method of an array substrate provided by the embodiment of the present invention is not limited to the above specific steps. For example, the sequence of forming the common electrode layer on the substrate and forming the pixel electrode layer on the substrate may be adjusted accordingly according to the structure of a specific array substrate, and the embodiment of the present invention is only described in detail by taking the above as an example. With the above steps, the array substrate shown in FIG. 3 can be formed.

The above descriptions are merely specific implementations of the present invention, but the protection scope of the present invention is not limited thereto. Variations and replacements which may be easily envisaged by those skilled in the art within the scope of the present disclosure should be covered by the protection scope of the present invention. Therefore, the protection scope of the present invention is defined by the protection scope of the claims.

The invention claimed is:

1. An array substrate, comprising:
    a substrate;
    a gate metal layer comprising gate lines;
    a source and drain metal layer comprising data lines, the gate lines and the data lines intersecting with each other to define a plurality of sub-pixel areas;
    a pixel electrode layer provided on the substrate, the pixel electrode layer comprising a plurality of pixel electrodes which are in one-to-one correspondence with the plurality of sub-pixel areas;
    a common electrode layer provided on the substrate, the common electrode layer being provided with a plurality of cutting holes at positions between adjacent pixel electrodes;
    a first insulating layer provided between the pixel electrode layer and the common electrode layer; and a second insulating layer provided between the gate metal layer and the source and drain metal layer,
wherein the plurality of cutting holes provided in the common electrode layer correspond to and extend along a length of the gate lines, a length of the cutting holes in an extending direction of the data lines is no less than a width of the gate lines, and a width of each of the cutting holes in an extending direction of the gate lines has a smaller size at both sides and a larger size in the middle, a plurality of slits are provided at a position corresponding to each of the pixel electrodes in the common electrode layer and extending in a parallel direction; and/or,
the plurality of cutting holes provided in the common electrode layer correspond to and extend along a length of the data lines, a length of the cutting holes in the extending direction of the gate lines is no less than a width of the data lines, and a width of each of the cutting holes in the extending direction of the data lines has a smaller size at both sides and a larger size in the middle, a plurality of slits are provided at a position corresponding to each of the pixel electrodes in the common electrode layer and extending in a parallel direction.

2. The array substrate of claim 1, wherein, a color filter layer is provided on the substrate, and the color filter layer is between the pixel electrode layer and the common electrode layer.

3. The array substrate of claim 2, wherein, the color filter layer has a thickness of 1.2~1.5 μm.

4. The array substrate of claim 1, wherein, a color filter layer is provided on the substrate, and the color filter layer is above the gate metal layer and the source and drain metal layer and below the pixel electrode layer and the common electrode layer.

5. The array substrate of claim 1, wherein, the pixel electrode layer is below the common electrode layer.

6. A display device, comprising the array substrate of claim 1.

7. A manufacturing method of an array substrate, comprising steps of:
forming, on a substrate, a gate metal layer comprising gate lines;
forming, on the substrate, a source and drain metal layer comprising data lines, wherein the gate lines and the data lines intersect with each other to define a plurality of sub-pixel areas;
forming a second insulating layer between the gate metal layer and the source and drain metal layer;
forming a pixel electrode layer on the substrate, wherein the pixel electrode layer comprises a plurality of pixel electrodes which are in one-to-one correspondence with the plurality of sub-pixel areas;
forming a first insulating layer on the substrate;
forming a common electrode layer on the substrate,
wherein, in the common electrode layer, a plurality of cutting holes are provided at positions between adjacent pixel electrodes,
wherein the plurality of cutting holes correspond to and extend along a length of the gate lines, a length of the cutting holes in an extending direction of the data lines is no less than a width of the gate lines, and a width of each of the cutting holes in an extending direction of the gate lines has a smaller size at both sides and a larger size in the middle, a plurality of slits are provided at a position corresponding to each of the pixel electrodes in the common electrode layer and extending in a parallel direction; and/or,
the plurality of cutting holes correspond to and extend along a length of the data lines, a length of the cutting holes in the extending direction of the gate lines is no less than a width of the data lines, and a width of each of the cutting holes in the extending direction of the data lines has a smaller size at both sides and a larger size in the middle, a plurality of slits are provided at a position corresponding to each of the pixel electrodes in the common electrode layer and extending in a parallel direction.

8. The manufacturing method of claim 7, wherein, after forming the pixel electrode layer on the substrate and before forming the common electrode layer on the substrate, the manufacturing method further comprises a step of:
forming a color filter layer on the substrate.

9. The manufacturing method of claim 7, wherein, before forming the pixel electrode layer and the common electrode layer on the substrate and after forming the gate metal layer, the second insulating layer and the source and drain metal layer on the substrate, the manufacturing method further comprises a step of:
forming a color filter layer on the substrate.

* * * * *